(12) United States Patent
Montemagno et al.

(10) Patent No.: US 7,208,089 B2
(45) Date of Patent: Apr. 24, 2007

(54) BIOMIMETIC MEMBRANES

(75) Inventors: Carlo D. Montemagno, Los Angeles, CA (US); Jacob J. Schmidt, Sherman Oaks, CA (US); Steven P. Tozzi, River Edge, NJ (US)

(73) Assignee: MT Technologies, Inc., River Edge, NJ (US)

( * ) Notice: Subject to any disclaimer, the term of this patent is extended or adjusted under 35 U.S.C. 154(b) by 89 days.

(21) Appl. No.: 10/627,967

(22) Filed: Jul. 28, 2003

(65) Prior Publication Data

US 2004/0049230 A1 Mar. 11, 2004

Related U.S. Application Data

(60) Provisional application No. 60/438,784, filed on Jan. 9, 2003, provisional application No. 60/398,784, filed on Jul. 29, 2002.

(51) Int. Cl.
*B01D 39/00* (2006.01)
*B01D 63/00* (2006.01)
*C12Q 1/00* (2006.01)
*H01L 31/00* (2006.01)

(52) U.S. Cl. ............... 210/500.27; 210/257.2; 264/41; 435/1; 435/4; 136/252; 436/172; 436/82.05

(58) Field of Classification Search ........... 210/500.35, 210/500.42, 641, 321.75, 257.2, 500.2, 7; 530/402; 435/17.1, 4; 436/524, 172, 82.05; 204/156.6; 514/2; 425/450, 1.21, 9, 32, 425/417, 489; 264/4.1, 4.3, 4.6, 41; 136/252; 424/450, 436

See application file for complete search history.

(56) References Cited

U.S. PATENT DOCUMENTS

| | | | | |
|---|---|---|---|---|
| 3,966,580 | A * | 6/1976 | Janata et al. | 204/403.07 |
| 5,914,367 | A * | 6/1999 | Dordick et al. | 525/54.1 |
| 5,998,588 | A * | 12/1999 | Hoffman et al. | 530/402 |
| 6,146,838 | A | 11/2000 | Williams et al. | |
| 6,177,181 | B1 * | 1/2001 | Hamada et al. | 428/304.4 |
| 6,319,469 | B1 | 11/2001 | Mian et al. | |
| 6,329,209 | B1 | 12/2001 | Wagner et al. | |

(Continued)

FOREIGN PATENT DOCUMENTS

DE 44 37 023 C1 2/1996

(Continued)

OTHER PUBLICATIONS

Nardin et al. "Hybrid Materials from Amphiphilic Block Copolymers and Membrane Proteins," Reviews in Molecular Biotechnology, Elsevier Science B.V. (Elsevier, Amsterdam, NL), vol. 90 (No. 1), p. 17-26, (Mar. 2002).

(Continued)

*Primary Examiner*—Ana Fortuna
(74) *Attorney, Agent, or Firm*—Jones, Tullar & Cooper, P.C.

(57) ABSTRACT

Biological membrane proteins are incorporated into a co-polymer matrix to produce membranes with a wide variety of functionalities. In one form of the invention, a composite membrane incorporates two different proteins which cooperate to produce electricity from light. In another form, water transport proteins are embedded in a membrane to enable water purification.

26 Claims, 15 Drawing Sheets

U.S. PATENT DOCUMENTS

| | | | |
|---|---|---|---|
| 6,342,389 B1 | | 1/2002 | Cubicciotti |
| 6,355,423 B1 | | 3/2002 | Rothberg et al. |
| 6,537,575 B1 | * | 3/2003 | Firestone et al. ........... 424/484 |
| 6,617,156 B1 | * | 9/2003 | Doucette-Stamm et al. ...................... 435/320.1 |
| 6,835,394 B1 | * | 12/2004 | Discher et al. ............. 424/450 |
| 6,875,354 B1 | * | 4/2005 | Kopaciewicz .......... 210/321.75 |
| 6,936,298 B2 | * | 8/2005 | Chaikof et al. ............ 427/2.24 |

FOREIGN PATENT DOCUMENTS

| | | |
|---|---|---|
| EP | 0 417 541 A2 | 3/1991 |
| JP | 62-221467 A | 9/1987 |

OTHER PUBLICATIONS

Uehara et al, "Photoelectric Response of Oriented Purple Membrane Electrodeposited Onto Poly (Vinyl Alcohol) Film," Thin Solid Films, Elsevier Sequoia, vol. 232 ( No. 2), p. 271-277, (Sep. 25, 1993).

Gill et al, "Bioencapsulation Within Synthetic Polymers (PART 1.): sol-gel encapsulated biologicals," Trends In Biotechnology, Elsevier Science Ltd. (Cambridge, GB), vol. 18 (No. 7), p. 282-292, (Jul. 2000).

Patent Abstracts of Japan, "Method for Preparing Purple Membrane-Containing Membrane", Tsuda Keishiro, Agency of Ind Science & Technol, JPO & Japio, (Mar. 17, 1988).

Fukuzawa et al, "Photoelectrical Cell Utilizing Bacteriorhodopsin on a Hole Array Fabricated by Micromachining Techniques," Sensors and Actuators B, Elsevier Science S.A. (Lousanne, CH), vol. 30 ( No. 2), p. 121-126, (Jan. 15, 1996).

Heyse et al, "Emerging Techniques for Investigating Molecular Interactions at Lipid Membranes," Biochimica et Biophysica Acta, Elsevier Science B.V. (Elsevier, Amsterdam, NL), vol. 1376 (No. 3), p. 319-338, (Nov. 10, 1998).

Naumann et al, "The Peptide-Tethered Lipid Membrane as a Biomimetic System to Incorporated Cytochrome C Oxidase in a Functionally Active Form," Biosensors & Bioelectronics , Elsevier S.A. (Barking, GB), vol. 14 (No. 7), p. 651-662, (1999).

* cited by examiner

BIOMIMETIC MEMBRANES

This application claims the benefit of U.S. Provisional Application No. 60/398,784, filed Jul. 29, 2002, and Provisional Application No. 60/438,784, filed Jan. 9, 2003, the disclosures of which are hereby incorporated herein by reference.

BACKGROUND OF THE INVENTION

The present invention relates to a method for producing man-made devices which have the properties and functions of biological membranes and membrane proteins, and to the structure of such devices.

Biological membrane proteins have a large variety of functions, including acting as pumps, channels, valves, energy transducers, and mechanical, thermal, and electrical sensors, among many others. Since these proteins are nanometers in size and highly efficient, they are highly attractive for use in artificial devices. However, their natural lipid membrane environment suffers from shortcomings such as low strength, necessity of an aqueous environment, and susceptibility to chemical or bacterial degradation.

SUMMARY OF THE INVENTION

Briefly, in one aspect of the invention, natural or genetically engineered membrane proteins are incorporated into a block co-polymer matrix, producing membranes with a wide variety of inherent functionality, including the ability to selectively transport and/or filter compounds between fluids. By selecting proteins with specific properties, membranes can be fabricated with a defined functionality including molecular scale addressability via directed electrostatic, electromagnetic, and chemical forces.

The block copolymers of the invention can be designed and created so that they have the following properties as desired: the ability to form membranes of a desired thickness; the ability to form membranes of a desired chemical composition; the ability to form membranes of high strength; and the ability to increase the strength of already formed membranes as desired. One of the most important properties of these membranes is that they are able to house natural biological membrane proteins in a functional state, and that these composite membranes are robust and long-lived, for by inserting biological membrane proteins into such polymer membranes, devices having the properties and functions of the proteins are created. Suitable polymers need only form membranes which separate the top and bottom halves of membrane proteins, be sufficiently similar to natural lipid membranes as to permit easy insertion of the proteins when they are properly oriented, and that they do not compromise the protein's natural function. Polymers which satisfy these conditions include tri-block copolymers having general properties of hydrophilic outer blocks and hydrophobic inner blocks.

One aspect of the invention concerns the creation of composite membranes containing two different proteins which, when acting in concert, result in a device which creates electricity from light, the "Biosolar Cell". Another aspect of the invention utilizes water transport proteins to enable water purification from arbitrary water sources. Descriptions of these aspects are given below.

As technological innovations resulting in device miniaturization have made electronics smaller, lighter, and more efficient, advances in sources of power for these devices have not progressed as rapidly. Power sources in the 21st century face the challenge of supplying energy to an increasing number of devices while decreasing in size and weight. In addition, tomorrow's products of nanotechnology and biotechnology will require power supplies that do not even resemble those used today in form or function.

There is a pressing need for lighter and more compact electrical power sources for a wide variety of emerging applications. Such power sources would enable a greater range of mission objectives than is achievable with modern battery technology, for maximizing the power density minimizes the weight needed to be carried for a given power requirement. The weight requirements are crucial since, for conventional fuel sources, the fuel source must be near the device and transported with it, if mobile. Exhaustion of the fuel is also likely and replenishment of that supply is then necessary. This can place a limit on the range and mobility of the user.

Contemporary science has shown the exciting potential promised in the development of nanobiotechnology. Manufacture of devices utilizing components in which no atom is wasted promises efficiency and miniaturization of the highest level. Although recent technical developments concerning power sources have been promising, they result from incremental improvements in existing technologies. Power sources ideally suited for the next generation of devices will utilize nanobiotechnology for their function and will also be able to power the present generation of devices at a high level of performance.

Only recently have the technology and knowledge necessary to develop the first nanobiotechnology devices become available, and the engineering and construction of nanometer scale organic/inorganic hybrid devices powered by the biochemical fuel ATP has been reported (Soong, R. K., Bachand, G. D., Neves, H. P., Olkhovets, A. G., Craighead, H. G., and Montemagno, C. D. (2000), Science 290, p. 1555–1558). The generation of ATP for use in these devices as well as the use of these devices to power other machines has motivated interest in the transfer of power between the macro-and nanometer scales as well as the interconversion of different types of energy.

In another aspect of the invention, other proteins with different functionality can be used to transport electrons/protons to enable the transduction of electrical and chemical power, and act as mechanical valves and sensors.

In a preferred form of the invention, the membrane is used to provide a biosolar-powered material and fabric which consists of a thin fabric incorporating a biocompatible polymer membrane embedded with two energy converting proteins, bacteriorhodopsin and cytochrome oxydase, that will convert optical energy to electrical energy and deliver this energy to an external load. A tremendous weight savings results from the use of thin (less than 1 μm) polymeric membranes as well as the lack of a need to carry fuel with the power source. Thus, a system can be developed that can be integrated into clothing and the surfaces of most materials, providing an effectively weightless (less than 1 kg/m$^2$) source of energy with an efficiency equal to or greater than that achievable with solar cells. The biosolar power material thus forms a hybrid organic/inorganic power source that obtains its energy from light.

The process of the present invention relates to the manufacture of a thin fabric consisting of a biocompatible polymer membrane embedded with two energy converting proteins, bacteriorhodopsin and cytochrome oxidase, that will convert optical energy to electrical energy and deliver this energy to an external load. These proteins have been separated and optimized by natural selection over millions of years to convert optical and electrical energy to electrochemical energy. Incorporated into a device, they provide useful amounts of power indefinitely and are sufficiently light, compact, and rugged for applications requiring high mobility in both hostile and friendly environments.

Bacteriorhodopsin is a bacterial protein that transports protons across a cell membrane upon the absorption of light. Cytochrome oxidase is a membrane protein that transports protons using high-energy electrons. These proteins are used in tandem to transform light energy into an electrochemical proton gradient that is subsequently converted to an electromotive force used to do external work. Because the device is a biological version of a conventional solar cell, there is no "fuel" to be carried along with the power supply, increasing the power density significantly. In addition, the maximum energy theoretically extractable from such a device is infinite, as it will work as long as the sun, or the device, does. The estimated areal mass density of the final device is ~100 g/m$^2$, providing an effectively weightless source of energy with an efficiency equal to or greater than that achievable with solar cells. The material composition and dimensions of this biosolar cell will ultimately result in large (>250 W/kg) power densities and large energy densities (800 Whr/kg for 3 hrs, 9500 Whr/kg for 3 days, 32000 Whr/kg for 10 days), enough to power a significant amount of equipment while effectively occupying zero volume and weight. In addition, there are negligible acoustic, thermal, and electronic signatures resulting from its operation.

There are important distinctions between the present power source and conventional solar cells, for since the present source is constructed from mass-produced proteins and common polymers, it will be lightweight, flexible, robust, and manufacturable in large quantities for low cost. The relevant length scale for this device is the thickness of the packaging, <1 µm. The membranes in which these enzymes normally exist have a thickness of 5 nm. Laminated sheets of the bio-solar cells can be incorporated into clothing and other surfaces that result in no weight cost, since they must be worn anyway. Appropriate modular design of the power-generating cells in the fabric will result in the ability of the power fabric to sustain significant damage and still retain functionality. The ability to interchange electrical and biochemical energy will enable the construction of electrically powered bio-devices as well as the conversion of biochemical fuel to electricity. The ability to transform energy between electrical, biochemical, and optical forms will allow the design and production of nanobiological devices unconstrained by the type of input energy.

BRIEF DESCRIPTION OF DRAWINGS

The foregoing, and additional objects, features and advantages of the present invention will be best understood from the following detailed description of preferred embodiments thereof, taken with the accompanying drawings, in which:

FIG. 4A illustrates liposomal incorporation into a planar solid supported lipid bilayer, while

DESCRIPTION OF PREFERRED EMBODIMENTS

In one form of the invention, bacteriorhodopsin and cytochrome oxidase are integrated into a biocompatible polymer membrane in contact with microfabricated electrodes. The operation of the proposed device can be best understood after bacteriorhodopsin, cytochrome oxidase, and their integration into lipid and polymer membranes are understood. All three have been extensively studied and have a wide body of literature concerning their synthesis and function.

Figure 1:
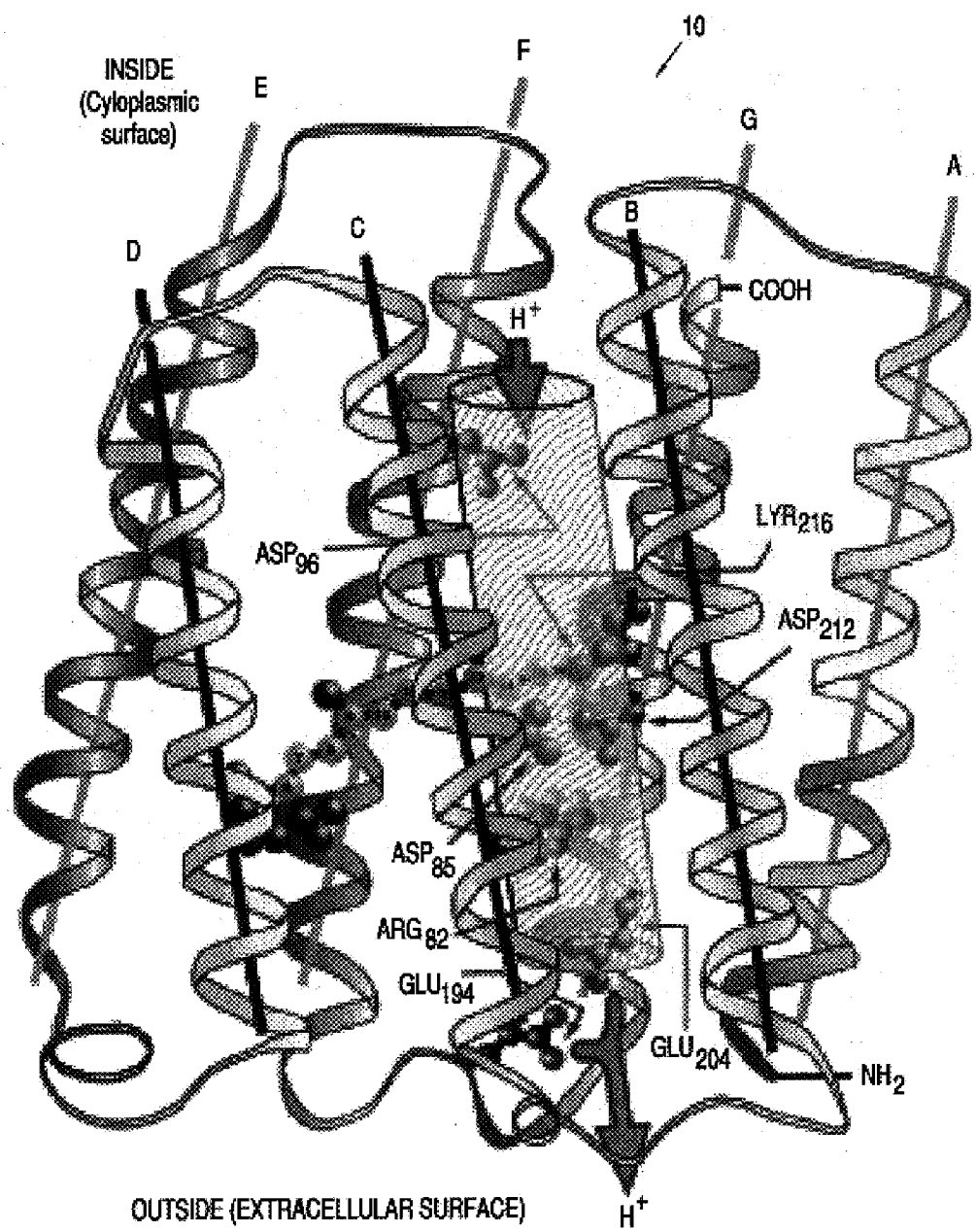
FIG. 1 is a diagrammatic illustration of a simplified backbone ribbon structure of bacteriorhodopsin, wherein protons are transported across the membrane via a central internal channel.
Figure 2:
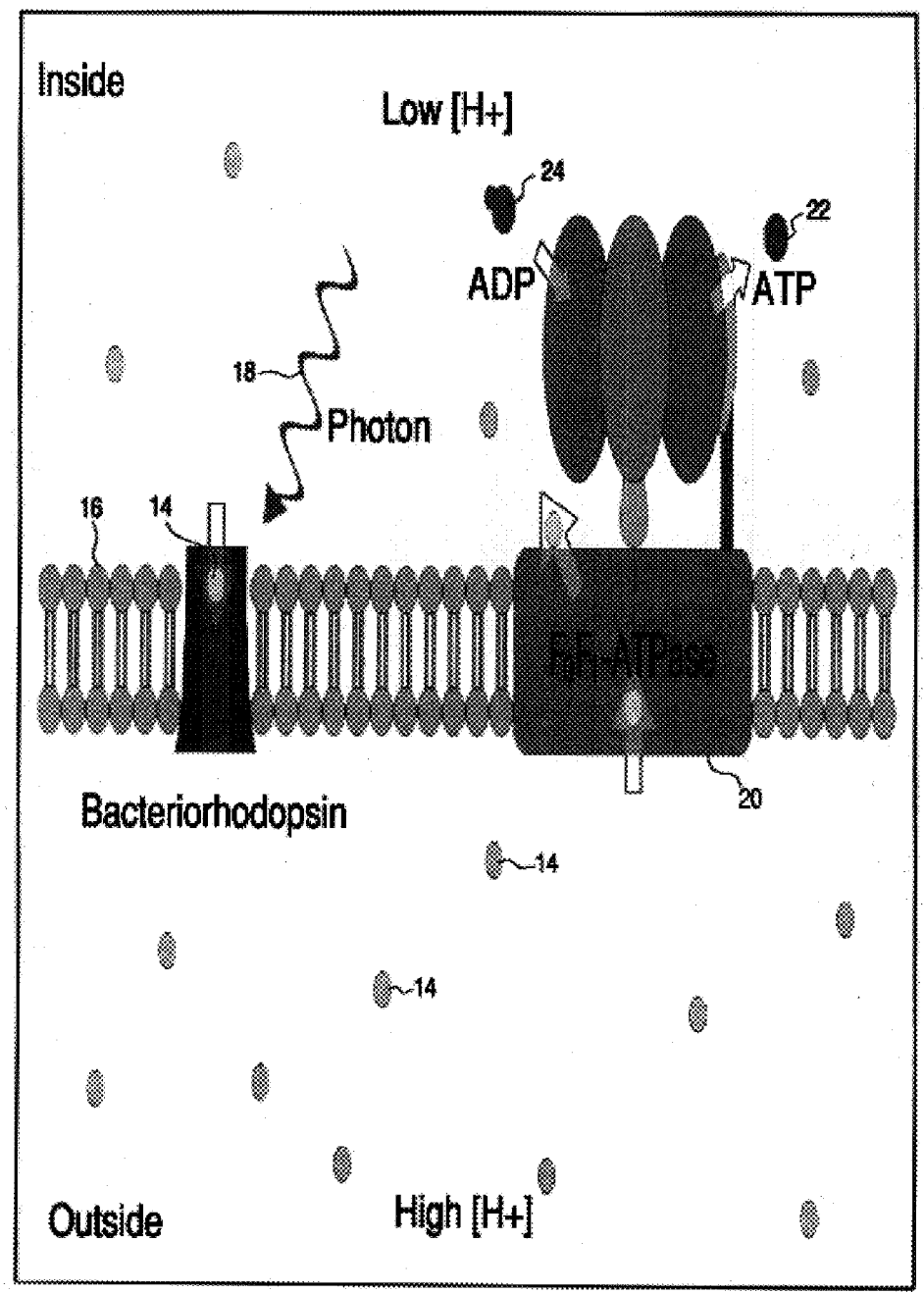
FIG. 2 illustrates the process wherein, in *H. salinarium*, BR pumps protons out of the bacterium upon absorption of a photon of green light, creating an electrochemical gradient, and wherein ATP synthase allows these protons back into the cell and uses their electrochemical energy to make ATP from ADP, providing a net conversion of energy from optical to chemical.

Bacteriorhodopsin (BR), the most widely studied ion transport protein, is a 26 kD molecular weight proton transporter, illustrated at 10 in FIG. 1, found within the cell membrane of *Halobacterium salinarium*, a halophilic archaebacterium that thrives in brightly lit brines and marshes. BR allows *H. salinarium* to survive in anaerobic environments; when there is insufficient oxygen for the process of respiration to occur, BR takes its place. As illustrated in FIG. 2, the BR 12 cell transports protons 14 across a cell membrane 16 and out of the cell upon the absorption of a photon 18 of green (λ=500–650 nm) light. Each BR molecule undergoes various electronic intermediate states as it is optically excited and transports a proton, with the total time for the return of BR to its initial state being on the order of 3 ms. This is the shortest time scale for energy transfer.

As protons 14 are pumped out of the cell 12 a charge and pH gradient (low H+ to high H+) forms across the cell membrane 16, forming an electrochemical potential. This potential provides the energy to power ATP synthase (ATPase), illustrated at 20, which, in transferring the protons 14 back across the membrane, uses their electrochemical energy to produce adenosine triphosphate (ATP) at 22 in FIG. 2. ATP is the universal biological fuel that powers the majority of cellular processes essential for life. This natural biological system has been replicated in the laboratory by the construction of a system consisting of BR and ATPase in a lipid vesicle (Pitard, B., Richard, P., Duñarch, M., and Riguard, J. (1996). *Eur. J. Biochem.* 235, p. 769–788), wherein, at a temperature of 40° C., BR was able to create and maintain a pH difference of 1.25 across the vesicle boundary. At 20° C., ΔpH=2 was obtainable. Higher pH differentials were unattainable due to feedback inhibition of the BR by the proton gradient. The proton gradient was used to generate ATP and measure the performance of both enzymes in the system. This work also demonstrated an increase in the coupling efficiency between BR and ATPase by the addition of negatively charged phospholipids in the liposomal membrane.

BR is an ideal candidate for device integration since the protein can exist in a high concentration as two-dimensional crystals in the cell membrane. It is unique among retinal proteins in this aspect. Called "purple membrane" in this form, it has a mass ratio of 7% protein to 25% lipid (~10 lipid molecules per protein). These patches of purple membrane are observed to be up to 0.5 μm and greater in size. Since these protein agglomerations are stable (and exist naturally) in such high concentrations, they increase the energy yield and provide an element of redundancy and engineering safety to any device made. in addition, the evolution of *H. salinarium* has optimized the function of BR, for it can operate at high temperatures in large light fluxes for extended periods of time.

The work of Pitard et al., cited above, made use of BR highly diluted in small (150 nm) lipid membranes, which demonstrated an ATP production rate inversely proportional to the BR/lipid mass ratio. Extrapolation of their data for the BR/lipid mass ratio of purple membrane yields 320 nmol of ATP produced per minute per mg of BR. ATPase synthesizes ATP from ADP indicated at 24 in FIG. 2, and inorganic phosphate, a 35 kJ/mol energy increase. Considering the mass of the purple membrane and lipid only, this light-powered ATP synthesizing system supplies power at a density of 140 W/kg. If ATP synthase pumped protons out as fast as BR pumped them in, the power generated would increase to 180–280 W/kg.

Owing to the large amount of scholarship concerning BR and its robustness and longevity, there is a considerable amount of interest and effort in the development of BR as an active optical element in optical devices and computer memory applications. Purple membrane has been shown to be active for years under illumination by light, and is stable in polymeric matrices up to 180° C., between pH values of 0 and 12, in the presence of organic solvents, and also when fully dehydrated (Vsevolodov, N. (1998), *Biomolecular Electronics: An Introduction via Photosensitive Proteins*, p. 125, Birkhauser, Boston.) The attention of the scientific and engineering communities has resulted in protocols developed for the production and isolation of BR over-producing strains of *H. salinarium* (Lorber, B. and DeLucas, L. J. (1990) *FEBS Lett.* 261, p 14–18). Procedures for the extraction and purification as well as the processing and handling of the purple membrane in large quantities are well known (e.g. Stuart, J. A.; Vought, B. W.; Schmidt, E. J.; Gross, R. B.; Tallent, J. R.; Dewey, T. G.; Birge, R. R. *IEEE EMBS*, in press). Experiments reporting its incorporation with non-biological materials have indicated that BR is compatible for use with common polymers such as poly(vinyl alcohol) and poly(acrylamide) (Birge, R., Gillespie, N., Izaguirre, E., Kusnetzow, A., Lawrence, A., Singh, D., Song, W., Schmidt, E., Stuart, J., Seetharaman, S., Wise, K. (1999), *J. Phys. Chem. B* 103, 10746–10766).

Figure 3A:
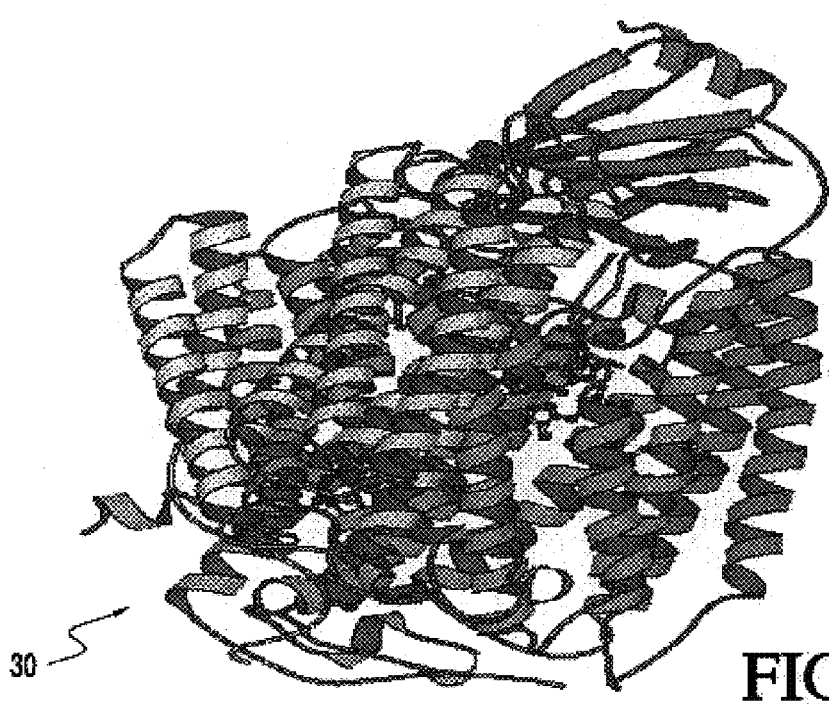
FIGS. 3A and 3B illustrate the backbone ribbon structure of COX, with FIG. 3A illustrating the Membrane view, and FIG. 3B the Cytosolic view, the three areas marked with stars being "pores" putatively attributed as proton transporting channels.
Figure 3B:
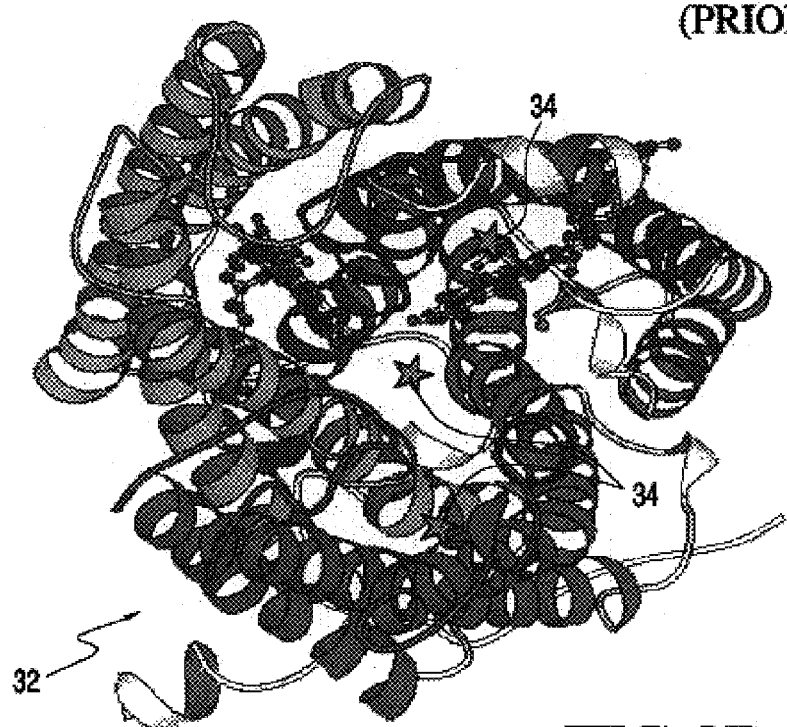

The second enzyme, cytochrome oxidase (COX), is an electron and proton transporting protein, the last of the four enzymes through which respiration occurs. FIG. 3A illustrates at 30 the Membrane view of the backbone ribbon structure of COX, while FIG. 3B illustrates at 32 its Cytosolic view, with the areas 34, marked with stars, illustrating "pores", or proton transporting channels. In respiration, the high-energy electrons of NADH (initially generated by the oxidation of glucose) are transferred to $O_2$ as it is reduced to make $H_2O$.

COX receives electrons from the previous stages of the respiration process, carried by cytochrome c, and transfers them to two internal heme groups containing iron and copper ions. These heme groups, reduced by the electrons received from cytochrome c, are deoxidized after transference of the electrons to a molecule of $O_2$ docked with one of the hemes. The $O_2$, having taken on the added electrons, becomes a target for a hydrogenic reaction with ambient protons and, following the reaction, is unbound from the heme. As these high energy electrons are transferred, the energy gained from their 460 mV potential drop (Nicholls, D. (1982), *Bioenergetics: An Introduction to the Chemiosmotic Theory*, p. 123, Academic Press, London) is used to transport protons into the mitochondrial space, with a typical ratio of one proton to one electron transferred (Lee, H., Das T., Rousseau, D., Mills D., Ferguson-Miller, S., Gennis, R. (2000), *Biochemistry* 29, 2989–2996), although other ratios have been discussed (Papa.S., Lorusso, M., and Capitanio, N. (1994), *J. Bioenerg. Biomembr.* 26, p. 609–617, Michel, H., Behr, J., Harrenga, A., andkannt, A. (1998), *Ann. Rev. Biophys. Biomol. Struct.* 27, p. 329–356) and are generally a function of membrane potential (Murphy, M. and Brand, M. (1988), *Eur. J. Biochem.* 173, p. 645–651).

As protons are pumped out of the mitochondrial matrix, an electrochemical proton gradient is created. This proton gradient is used by ATPase to generate ATP. BR and COX are very similar in their resultant production of a proton gradient; that of BR is enacted by light, that of COX by chemical energy. This can be seen in FIG. 2, substituting COX for BR 12, high-energy electrons from cytochrome c for the green photon 18, and adding the reduction of oxygen to water. Indeed, both BR and COX are used in *H. salinarium* and for the same purpose: BR is used in *H. salinarium* when there is not enough oxygen for respiration and COX to be useful to the organism.

Figure 4A:
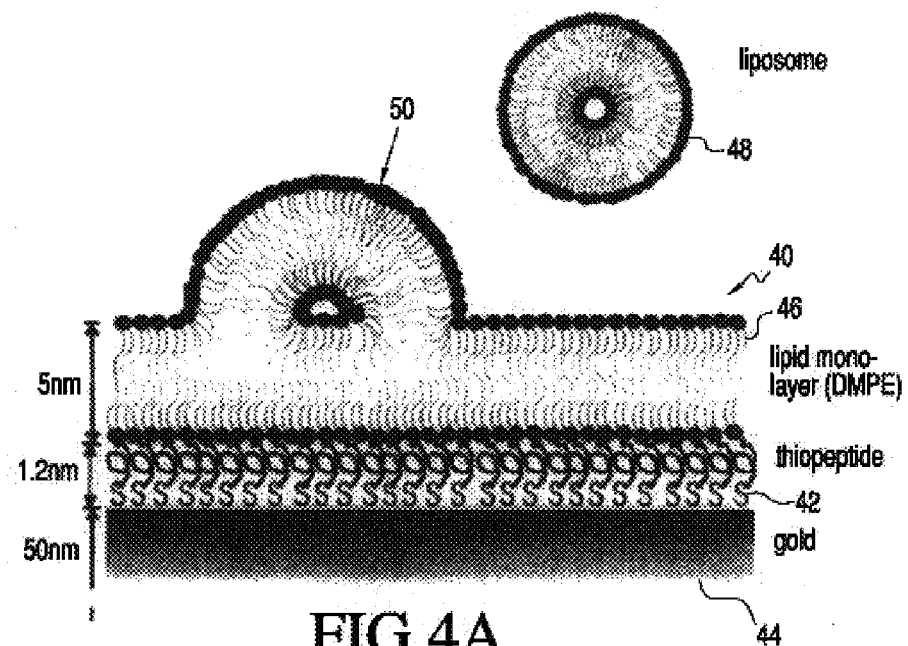
Figure 4B:
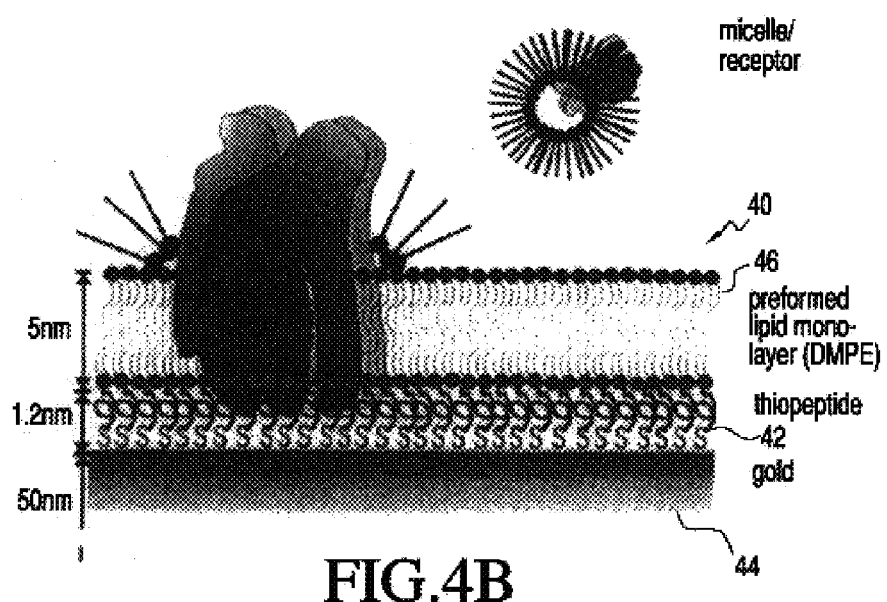
FIG. 4B illustrates the merger of Vesicles incorporated with COX into the planar membrane.

Integration of COX into solid substrate-supported lipid membranes 40, as illustrated in FIGS. 4A and 4B, has shown that it is possible to measure the electron transport as well as to control the proton transport electrically (Naumann, R., Schmidt, E., Jonczyk, A., Fendler, K., Kadenbach, B., Liebermann, T., Offenhausser, A., Knoll (1999), *Biosensors & Bioelectronics* 14, p. 651–662). These experiments used thiol-functionalized peptide chains 42 attached to a gold film 44 to serve as a substrate for lipid membrane monolayers 46 of dimyristoyl pnosphatidly ethanolamine (DMPE). COX and cytochrome c were incorporated into liposomal vesicles 48 of DMPE, which fused onto the peptide surface as illustrated at 50 in FIG. 4A. Electrical measurements demonstrated electron transfer through the COX to and from the gold substrate as well as the controlled transport of protons resulting from an applied current.

While in vitro experiments provide the most accurate recreation of the natural environments of membrane bound proteins, these conditions are not the most conducive for measurements of phenomena which can be obscured by other cellular processes or occur infrequently on an experimental time scale. In addition, production of useful devices using proteins as active elements requires an easily produced and maintained support which does not denature the protein and maintains the protein function as closely as possible to that in vivo, while allowing ease of use and manufacture. A large number of biological enzymes have been incorporated into artificial lipid membranes in laboratory experiments while retaining their function for experimentally useful times; the present invention is directed to the use of both lipid and polymer membranes for the production of BR/COX light powered devices.

Artificial lipid membranes made from phosphatidylcholine or DMPE replicate the amphiphilic composition of natural cell membranes. Membrane proteins are solubilized with the addition of a detergent such as Triton-X or dodium dodecyl sulfate and incorporated into liposomes by gentle sonication of the protein/lipid solution. The liposomes can be maintained in vesicle form (Pitard et al., 1996) or allowed to form a planar surface in the presence of a flat substrate (Naumann et al., 1999 and also Steinberg-Yfrach, G., Rigaud, J., Durantini, E., Moore, A., Gust, D., Moore, T. (1998), *Nature* 392, p. 479–482). Biological function of the proteins is maintained and concentrations of the protein thousands of times higher than that in vivo can be obtained, resulting in high experimental sensitivity and accuracy. High protein concentration is also necessary for the construction of power sources and biosensors that make use of the collective effects of individual molecular events.

Given the properties of BR, the power expected from a device utilizing BR and COX to synthesize electricity can be estimated. Approximately $7.5 \times 10^{20}$ solar photons in the green range are incident per square meter of the earth's surface every second, or $1.9 \times 10^4$ on the area of a BR molecule (25 nm$^2$). The absorption coefficient of BR is 66000/mol/cm (Vsevolodov, N. (1998) *Biomolecular Electronics: An Introduction via Photosensitive Proteins*, p. 125, Birkhauser, Boston), or about $4.4 \times 10^{-4}$ per monolayer of R. The quantum efficiency of BR is 0.7, giving a proton transport probability of $3.08 \times 10^{-4}$. Therefore, approximately 5.8 transport events/sec/BR molecule in sunlight can be expected.

In an area of one square meter a BR:COX ratio of 57:1 gives a steady state proton transfer rate of one proton by BR for every proton by COX. At this ratio, there are $3.9 \times 10^{16}$ BR per square meter of monolayer. Since one electron is transported per proton in COX, a current of 37 mA per square meter per monolayer is obtained. One thousand monolayers stacked utilizes only 36% of the light, but increases the current to 37 A/m$^2$ at 760 mV, giving 28 W/m$^2$. Although these current and voltage levels may not be suitable for all devices, the electrical output of the device is highly configurable, and a large range of voltage and current combinations are possible for any power output. The mass of protein and lipid (or equivalent) in this system is 2.3 g/m$^2$. With gold electrodes and polymer layers of poly-vinyl alcohol having the same thickness (5 nm), an areal mass density of 105.3 g/m$^2$ is obtained, yielding a power density of over 265 W/kg. The energy available from this devices is 795 Whr/kg for a three hour time period, 9540 Whr/kg for a three day time period, and 31800 Whr/kg for a ten day time period. Since the energy is obtained from the sun, the energy extracted increases directly with the duration of solar exposure.

These power and energy densities can be increased with alternate choices of electrode and polymer materials, but could also be decreased with different choices of layer thickness due to additional weight and light scattering. The effects of light scattering by the electrode and polymer materials may be ignored for the following reasons: (1) the polymer used is chosen for minimal activity in the range $\lambda=500$–650 nm; and (2) the metallic electrodes do not absorb the fraction of non-transmitted light through the initial layers of the device; if it interacts with the electrodes, it will merely be reflected within the device to be absorbed ultimately by the BR.

As described above, BR and COX are both proton transporters that transform the energy from light and high-energy electrons, respectively, into the proton gradient that drives ATPase and the production of ATP. Running COX in reverse, a proton gradient can be transformed into an electromotive force (EMF), imparting energy to electrons. By eliminating the oxygen and cytochrome c and replacing them with electrodes connected to an external load, the EMF can then be made to do work. The combination of BR and COX in an electrode-overlaid membrane culminates in the process and structure illustrated in FIG. 5, which is a diagram of a biosolar cell 60 in which Bacteriorhodopsin 62 transports protons 64 across a polymer membrane 66 upon the absorption of a photon 68 of green light. This increases the proton concentration on the upper side 70 of the membrane, causing cytochrome oxidase (yellow) 72 to operate in reverse. As a result, electrochemical energy is extracted from protons 64 transported to the lower side 74 and this energy is used to transport electrons 76 from an upper electrode 78 on the upper side of the membrane to a lower electrode 80, on the lower side of the membrane, creating an electromotive force across the electrodes which is used to do external work.

At the completion of electron transfer, the system has returned to its initial state: COX has been reduced and re-oxidized, the proton concentration on both sides of the polymer membrane 66 is unchanged, and the electrodes have not acquired or been depleted of any net charge. External work has been done by the EMF and a photon has been absorbed. The system is ready to convert the optical energy of the next photon to electrical energy.

The central process in the transformation of proton motive force to electromotive force is through the operation of COX 72 in reverse. There are many examples in the literature of reversible energy converting proteins such as $F_0F_1$-ATPase (Hammes, G. (1983), *Trends Biochem. Sci.* 8, p. 131–134) and ion transporters (Nicholls, D. (1982), *Bioenergetics: An Introduction to the Chemiosmotic Theory*, p 123, Academic Press, London). However, there are also energy converting proteins which do not operate in reverse: e.g. bacteriorhodopsin does not emit green light in response to a proton gradient.

In work by Wikstrom (Wikstrom, M. (1981), *Proc. Natl. Acad. Sci. USA* 78, p. 4051–4054), a partial reversal of electron flow in COX was observed in mitochondria with the addition of ATP. $F_0F_1$-ATPase is a reversible proton pump with the following functions; ATPase transfers external protons into the mitochondrial matrix in making ATP. In reverse, it can consume ATP to pump protons out. As described by Wikstrom, ATPase transfers protons across the membrane, in parallel with COX, upon the addition of ATP. This reaction creates a large proton concentration on the external side of the membrane, forming an electro-osmotic proton pressure gradient backwards on COX. When this condition is created, shifts in absorption spectra are observed that indicate electron transfers from water to the hemes, the reverse of the typical process. The following analysis illustrates why this occurs.

In electrochemical reactions, the energy surplus or deficit as the reaction progress is given by (see for example, De Vault, D. (1971), *Biochim. Biophys. Acta* 226, p. 193–199):

$$-\Delta E = \frac{\Delta G}{nF}$$

where ΔE is the change in redox potential before and after electron donation, ΔG is the free energy change in the reaction, n is the number of electrons transferred, and F is the Faraday constant. In the transfer of electrons from cytochrome c (reduction potential=+220 mV) through COX, the electrons are continuously decreasing their free energy, until they finally reduce $O_2$ (reduction potential—+860 mV) to make $H_2O$. The free energy change per electron transferred is −14.8 kcal/mol. This energy is used to transport protons and create an electrochemical gradient. Wikstrom increases the external proton concentration sufficiently that ΔG is positive for the normal action of COX, making the forward pumping of protons require more energy than the reduction of $O_2$ can offer. Through the use of a "redox buffer" the redox potential of cytochrome c is kept constant; this implies that as ΔG changes, the redox potential of $H_2O/O_2$ changes. As a sufficiently large external proton concentration is created, the electron transfer proceeds in reverse, receiving electrons from water and donating them to COX. However, the full reverse transfer of electrons is not completed, as $O_2$ was not generated.

Figure 5:
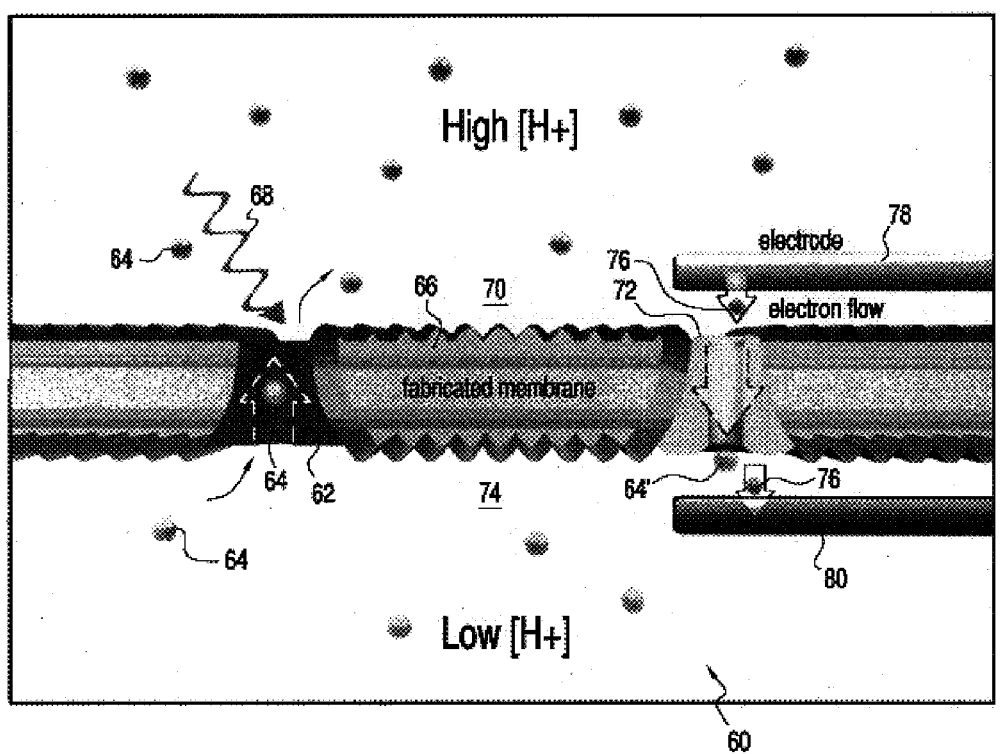
FIG. 5 is a diagrammatic illustration of a bisolar cell in accordance with the present invention.

In the system of the present invention, illustrated in FIG. 5, the COX does not have either the initial electron donor, cytochrome c, or the ultimate electron acceptor, $O_2$ of the system described by Wikstrom. Because the electron source is the electrode 78 and not water, there is a minimal cost for electron extraction as compared to 820 mV for $H_2O$. The electrons experience a positive redox potential of +380 mV as they arrive on the heme $a_3$, which can be used to do external work. This potential is decreased by 140 mV to +240 mV to heme a, which requires energy input from the proton gradient. The potential is further decreased by 50 mV to +190 mV to $Cu_a$, and is finally transferred to electrode 80 at 0V, also requiring input energy. Since the transfer of electrons from the initial electrode 78 to heme $a_3$ is an increase in reduction potential (decrease in free energy), this reaction will occur spontaneously. The transfer of electrons from $a_3$ to the counter electrode is a decrease in reduction potential of 380 mV, and will require an external energy input (the proton motive force) to occur. The proton motive force can be made larger through the use of BR 62 and proper doping of the membrane 66. Because the electrodes are the electron donors, the extraction of electrons from them is much easier than from $H_2O$, and any chemical intermediates between water and oxygen will be avoided.

Because the diffusion of ions on membrane surfaces is large and can be made larger by the suitable choice of membrane composition, the membrane surface itself is all that is required for the successful functioning of the biosolar cell (Pitard et al., 1996). Lipid membranes such as membrane 40 (FIG. 4A) or any one of many bio-compatible polymer matrices, contain the proteins and serve as proton barriers. These polymer matrices are very general, requiring only that (a) they form membranes which separate the top and bottom halves of the proteins, (b) they form an environment sufficiently similar to the natural lipid membrane so that the proteins can be easily inserted into the membrane with the proper orientation, and (c) the local chemical environment of the polymer membrane experienced by the protein does not cause the protein to unfold or deform in such a way as to comprise the protein's natural function. Polymers which satisfy these conditions include, but are not limited to, tri-block copolymers having general properties of hydrophilic outer blocks and hydrophobic inner blocks. BR 62 and COX 72 are oriented and combined in the polymer membrane 66, and the membranes are overlaid with electrodes 78 and 80.

Figure 6:
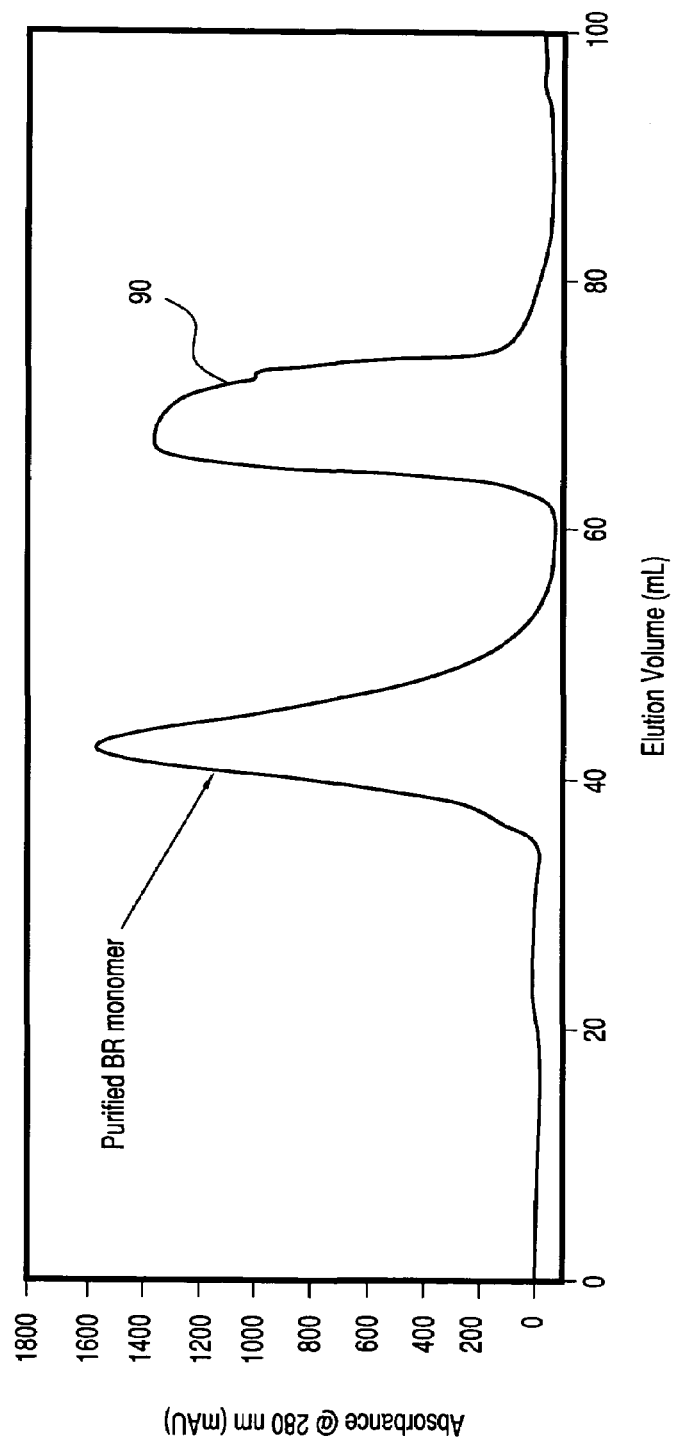
FIG. 6 is a chromatogram of purified bacteriorhodopsin.

FIG. 2 illustrates the construction, implementation, and evaluation of a light-driven ATP production system capable of continuously fueling F1-ATPase-powered nanomechanical devices. The present invention, as illustrated in FIG. 5, involves the construction of liposomal vesicles 66 containing BR and ATPase oriented in such a way that ATP is continually generated from ADP using the energy from green light. Systems for large-scale production and purification of bacteriorhodopsin (BR), isolated from an overproducing *Halobacterium* sp. and purified using gel filtration chromatography (curve 90 in FIG. 6) have been established.

Figure 7:
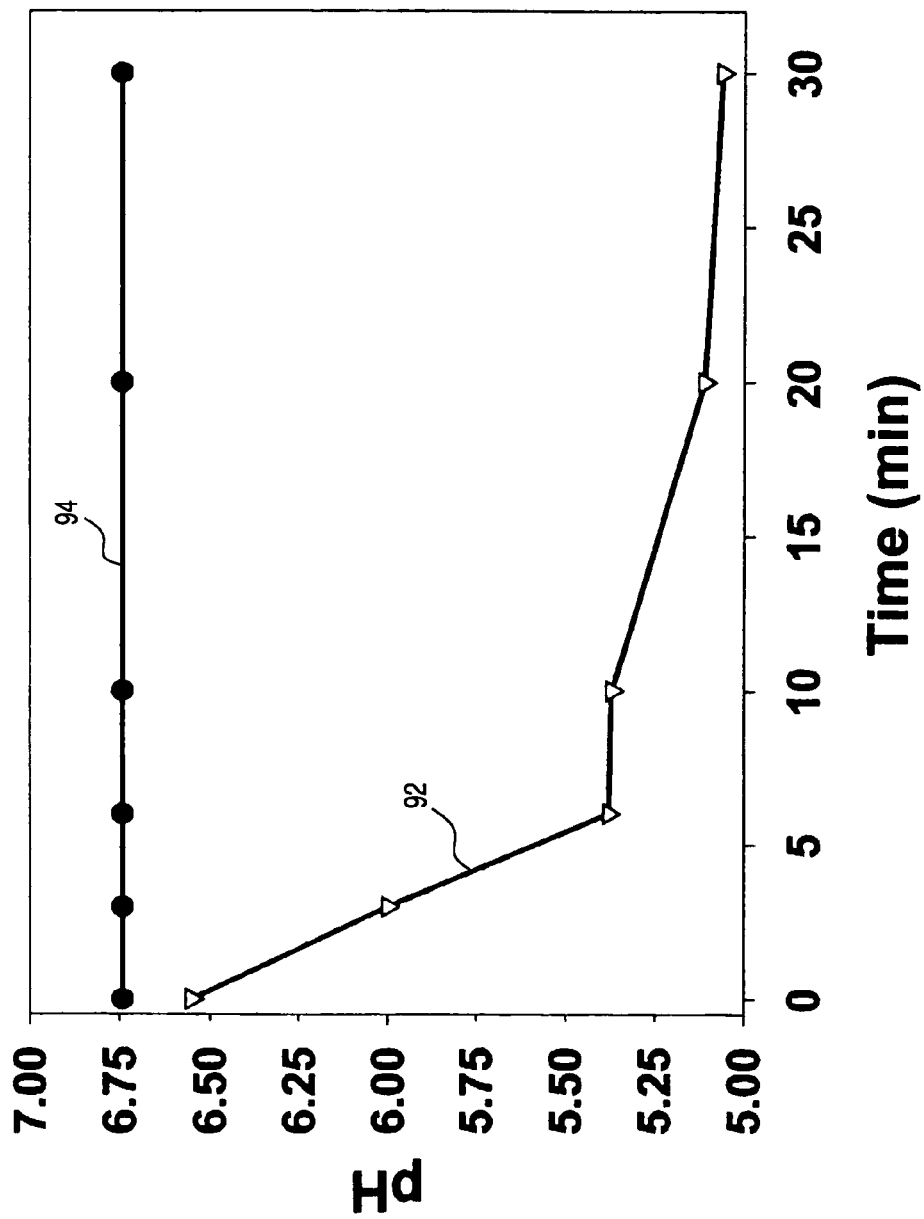
FIG. 7 graphically illustrates a pH gradient formed over 30 min by liposomes with (σ) and without (□) bacteriorhodopsin.

In accordance with the invention, liposomes were reconstituted using purified phosphatidylcholine, phosphatidic acid, and cholesterol according to procedures previously described (Pitard et al. 1996). The liposomes were sequentially size selected using 0.45 and 0.2 μm filters, leaving liposomes less than 200 nm in solution. Incorporation of $F_0F_1$-ATPase and BR was performed in the presence of Triton X-100. To ensure that liposomes were formed, pyranine was incorporated as a pH sensitive indicator that was visually assessed using fluorescence microscopy. This work showed that pH gradients as large as 1.5 can be attained at 20° C., illustrated at curves 92 and 94 in FIG. 7, which shows the pH gradient formed over 30 minutes by liposomes with (curve 92) and without (curve 94) bacteriorhodopsin.

Figure 8:
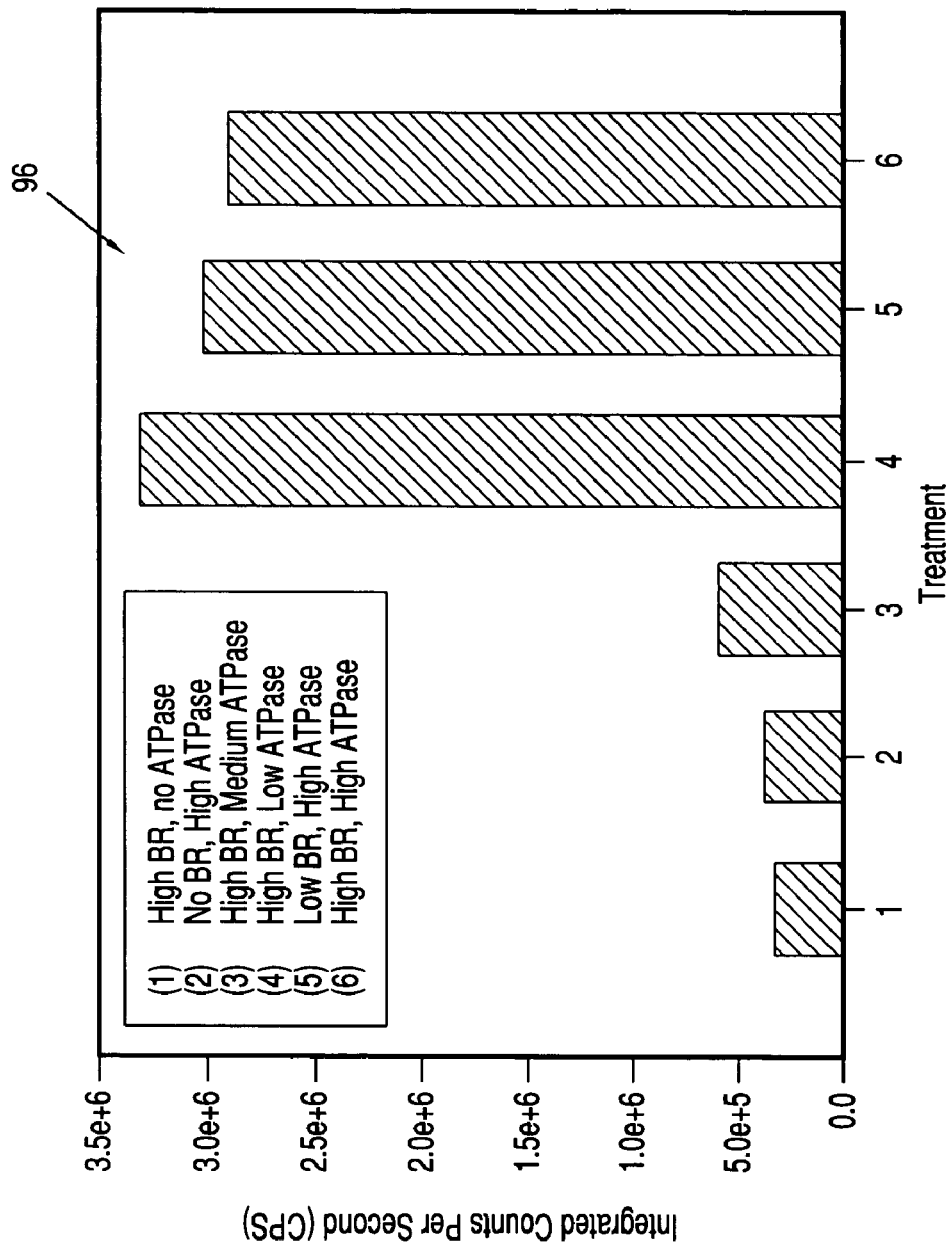
FIG. 8 illustrates Luciferin luminescence due to the presence of ATP produced by liposomes containing varying amounts of bacteriorhodopsin and $F_0F_1$-ATpase.

Assays have demonstrated the production of ATP by liposomes, as illustrated at 96 in FIG. 8. This figure illustrates Luciferin luminescence due to the presence of ATP produced by liposomes containing varying amounts of BR and $F_0F_1$-ATpase. Liposomes were incubated under light for 2.5 hours prior to the addition of ADP to the solution. The goal was to optimize the electrochemical gradient such that the steady state ATP production rate increases to the levels previously described (Pitard et al. 1996).

Figure 9:
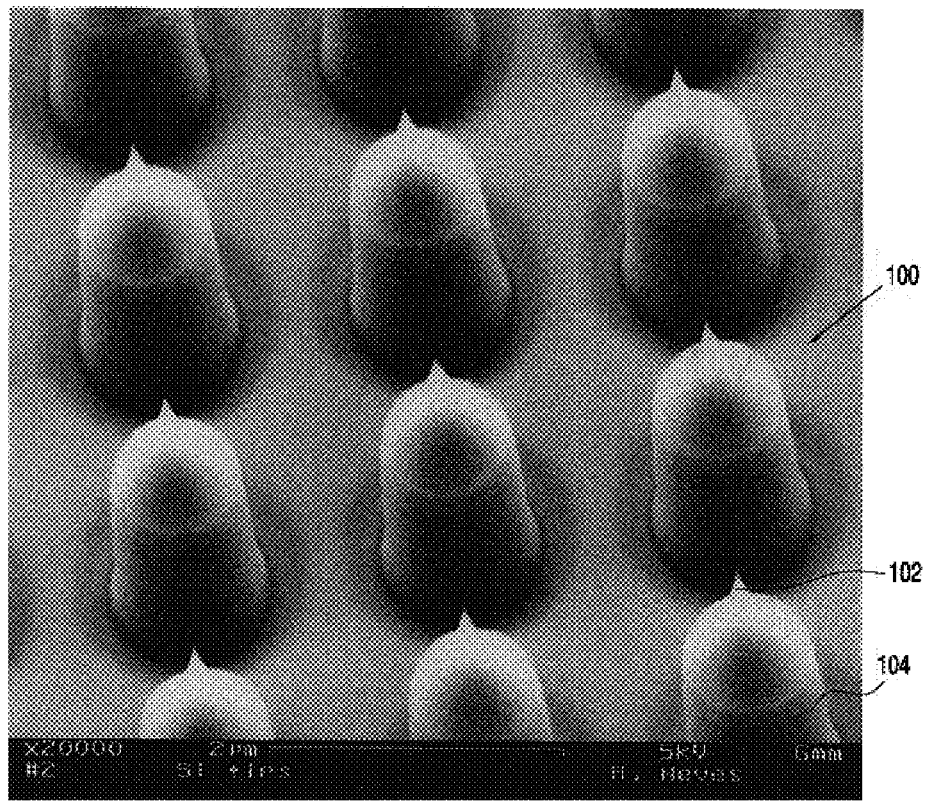
FIG. 9 is a SEM micrograph of an array of silicon tips (<10 nm tips, ~1 µm shaft)

Arrays of hollow cylinders with atomically sharp tips— "nano-syringes"—have been used to inject the nanoscale hybrid molecular devices mentioned above into living cells. The first step in this process is to construct non-hollow versions of the nano-syringes. FIG. 9 is a micrograph of part of a silicon tip array 100 including tips 102 that are less than 10 nm in diameter with shafts 104 approximately 1 μm in diameter. These arrays 100 are used as electrodes for the electrochemical deposition of arrays of nanometer scale nickel dots that serve as supports for various molecular devices. These arrays also allow direct deposition of micron- or nano-scale electrodes directly on top of a protein-studded membrane.

The production and synthesis of BR is routine. The halobacteria are fermented in 50 L batches, and after fermentation, processing, and purification, the process yields >100 mg of purple membrane. This corresponds to a protein monolayer area of approximately 60 $m^2$, which is ample for prototype devices.

Figure 10:
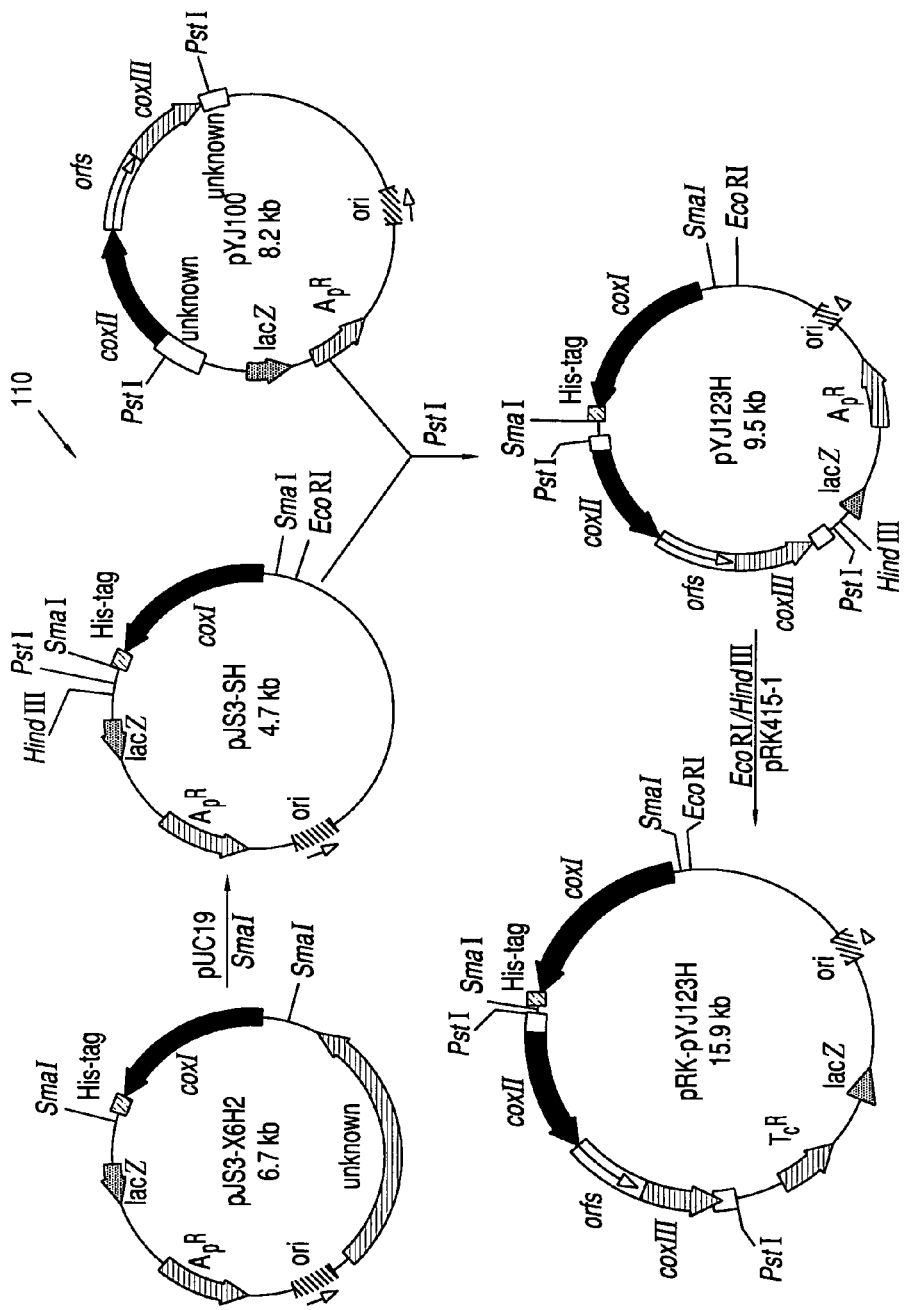
FIG. 10 is a diagrammatic illustration of a process for the overexpression and purification of COX.

The protocol described in Zhen, Y., Qian, J., Follmann, K., Hayward, T., Nilsson, T., Dahn, M., Hilmi, Y., Hamer, A., Hosler, J., Ferguson-Miller, S. (1998), *Prot. Expr., and Pur.* 13, 326–336, is used for the production of COX (Zhen et al., 1998). This method concerns the overexpression and purification of COX from *Rhodobacter sphaeroides*, illustrated in FIG. 10 at 90. The procedures for construction of overexpression plasmid pRK-pYJ123H includes subcloning a subunit I gene (cox1) of cytochrome c oxidase from R. sphaeroides into pUC19 using the SmaI sites in pJS2-X6H2, creating pJS3-SH, as illustrated., The six-histidine sequence, labeled His-tag, is located at the C-terminal of cox1 and pYJ124H is created by ligating a PstI/PstI fragment from pYJ100 into the unique PstI site at pJS3-SH. Subsequently, the three subunit genes are placed into the expression vector-pRK415-1 using EcoRI and HindIII sites. This procedure yields 61 mg per 10 L culture, which is a large amount with a correspondingly large monolayer area.

Figure 11:
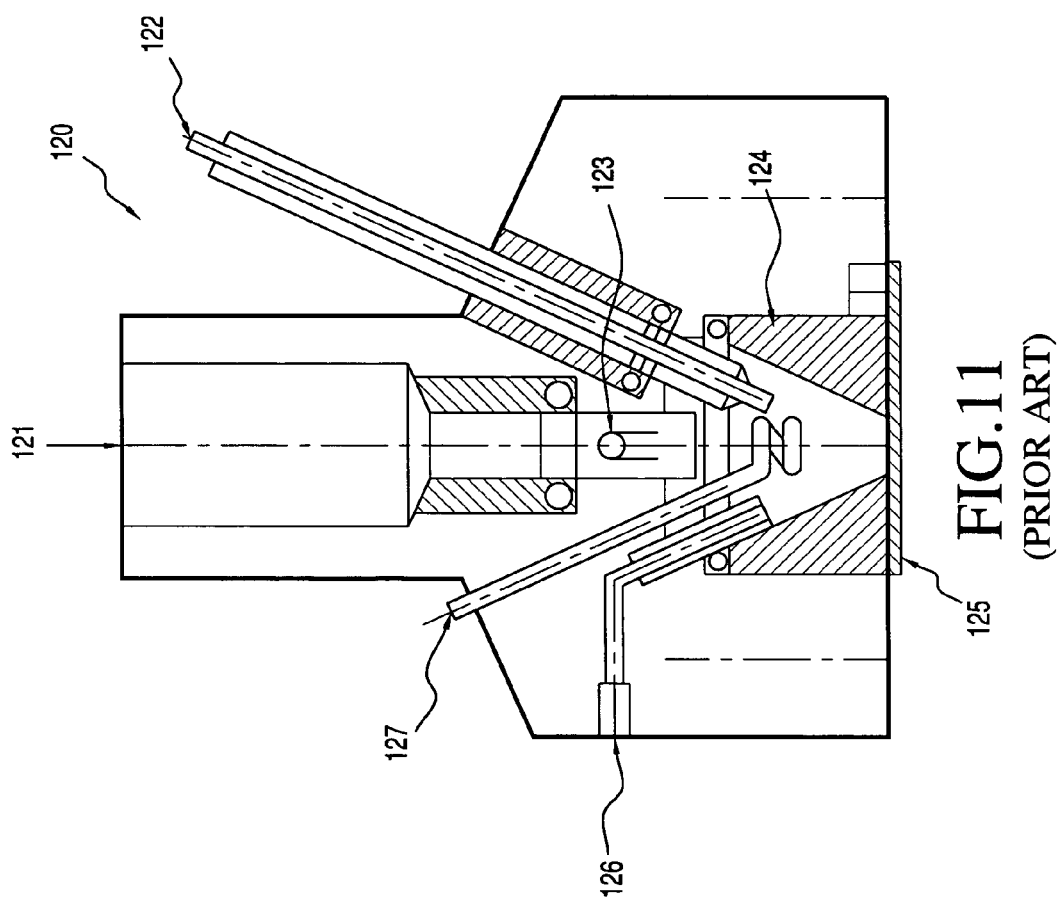
FIG. 11 is a diagrammatic illustration in partial cross-section of apparatus in which proton and electron transport through COX may be measured and controlled.

The production and synthesis of BR and BR-incorporated liposomal vesicles is routine. Orientation of the BR before insertion into the lipids through the use of a uniform applied electric field is most easily facilitated through a membrane with planar symmetry, although it is problematic with spherical vesicles. The measurement apparatus illustrated at 120 in FIG. 11 is an electrochemical cell used for impedance spectroscopy, and is designed to measure electron transport and potentials resulting-from proton transport, and is used for planar membranes. In addition, it is easily adapted for the application of an electric field to a membrane/protein complex. This cell includes a stopper 121, an Ag:AgCl sat. KCI reference electrode 122, a liquid outlet 123, a Teflon spacer 124, a golf support 125, a liquid inlet 126, and a platinum counter electrode 127, as described in Naumann.

There are many published techniques concerning the orientation of purple membrane and BR: electrostatic layer-by-layer assembly; electric field enhanced Langmuir-Blodgett film formation; orientation of BR in the electric field of an aerial condenser; electric field applied directly to the suspension; and a combination of electric and magnetic fields. Most of these methods utilize the large natural permanent electric dipole moment of PM ($\sim 10^6$ Debye for a 1 μm diameter particle). This large moment arises from the additivity of the individual BR moments (estimated from theoretical calculations as 570 Debye and experiments as 55 Debye). Electric fields only ~20 V/cm in strength applied perpendicular to the membrane are sufficient for orientation of BR, and are easily obtainable.

The dipole moment of COX has been posited to be sufficiently large to enhance the docking of cytochrome c. COX uses its internal dipole to attract and repel protons across the membrane, as does BR. Because the cytosolic portions of COX are hydrophilic, the enzyme will have a barrier to rotation in the lipid. The oblong shape of the protein will also inhibit this motion. Therefore, it is necessary to orient the COX before it is incorporated into the lipid membrane. Addition of the PM after the COX requires significantly lower fields for orientation so that the alignment of the COX will not be disturbed. If alignment of COX requires voltages incompatible with the other parts of the experiment, such as the lipid membrane, BR, or the hydrolysis of water, the counter-electrode is moved closer and the applied voltage is left at a safe level, ensuring the production of the required fields while leaving the remainder of the process unperturbed.

The apparatus discussed above, used to orient PM and COX each individually in liposomal membranes, is also used to measure proton transport in BR and electron transport through COX.

Initial experiments using only oriented BR incorporated into a liposomal membrane were performed using the structure describe above with respect to FIG. 5. Proton pumping across the membrane resulted in easily detectable signals. These experiments were repeated with COX.

The role of the electrodes 78 and 80 in the apparatus of FIG. 5 is to source and sink electrons, acting as surrogates for the cytochrome c and $O_2$, which are not present in the device. Because the passing of current through the COX 72 to pump protons may complicate the measurement of proton flux, a pH sensitive fluorescent indicator similar to that used in previous experiments with liposomal BR was used. The ability of the electrodes to interface with COX was evaluated by placing the protein alone in the lipid membrane. Using the same method to monitor proton pumping of BR mentioned above (Naumann et al., 1999), the ability of COX to pump protons using electrons transferred from the attached electrodes was studied. Experiments both with and without the applied orienting electric field showed that the orientation was successful. A major consequence of electrically induced proton pumping is that ATPase can then be incorporated into the lipid membranes with COX. Activating the COX generates a proton gradient, which the ATPase can then use to make ATP. This demonstrates the synthesis of ATP electrically, a major milestone in biology and significant for the further development of ATP powered nanodevices.

As a test of the reverse function of the enzyme, an artificial pH gradient is generated by making one side of the membrane space more acidic than the other. After verifying the orientation of the COX by measuring the proton transport, the voltage and current flowing through the COX as a result of the backward proton flow is measured. This electron flow may not occur if the electrodes are in the configuration shown in FIG. 11, in which case the top electrode may be placed much closer to the top surface of the membrane.

There are many strategies employable to increase the proximity of the electrodes to the proteins. An electrode grid may be placed directly on top of the lipid in the form of a thin wire mesh connected externally for electrical measurement. After removing the liquid above the top surface, a thin transparent layer of aluminum or nickel may be sprayed directly on the membrane to form the counter electrode. Alternatively, the electrodes may be electrochemically deposited onto the lipid surface by rastering the array of tips shown in FIG. 9. This deposition would result in millions of nanoscale wires on the top surface of the membrane. The above steps are repeated and combined, resulting in oriented COX and BR contained in a lipid membrane.

There are two possible scenarios for the orientation of BR and COX: parallel and anti-parallel dipole orientation. If the dipoles are parallel, the alignment can be achieved for both, simultaneously, through the application of a single field. If they are anti-parallel, the large aggregate dipole moment of PM is utilized. The proper orientation will be achieved by the initial orientation of the COX in a high field followed by the orientation of PM in a field sufficiently small to avoid the perturbation of the COX, but large enough to sufficiently manipulate the PM fragments.

Initially, the measurement of a voltage should indicate that the BR is functioning properly and that there is a proton gradient formed. The transmembrane voltage from this gradient is expected to be in the hundreds of mV. Subsequent measurement of a current demonstrates the success of the concept and yields an estimate of the fraction of functioning COX proteins accessible by the electrodes in the membrane.

Because the back transfer of protons though the COX and, therefore, the current, is dependent on the proton concentration supplied by the BR, the current should be proportional to the light intensity. The total current will also be proportional to the number of functioning COX molecules due to the parallel configuration of the COX molecules in the liposomal membrane. As stated above, the voltage generated should be constant, >200 mV, so the generated power will be determined by the light intensity and the net population of COX oriented in the appropriate direction.

Strategies for maximizing the power center on optimizing the orientation of the COX as well as appropriate choices and modifications of the membrane layer. The device may deliver power in a variety of illuminations; for example, continuous illumination at high and low intensities, periodic illumination, etc.

The use of polymer membranes is desirable for the following reasons: they have a longer lifetime than lipid membranes, they are more rugged, and they have more easily tailored properties, such as electron and ion conductivity and permeability. The interiors of these membranes must be hydrophobic and elastic so that the natural protein environment can be simulated as close as possible.

A wide variety of biocompatible polymers exist having a wide range of properties such as optical absorbance, polarity, electrical and ionic conductivity among others. Polymers enhancing the properties of the solar cells of the present invention must be compatible with the proteins and electrodes. Impermeability to protons is also important. The ability to dope the surface of the polymer may be significant, as it can play a major role in the proton conductivity and transmembrane conductance. The lifetime of the polymer as well as its effects of the lifetimes of the proteins contained within it are also relevant, and are factors in its selection. The choice of a polymer with a short lifetime but high performance may be useful in special applications.

The foregoing methods for the production of highly efficient and productive solar power sources made with biological components demonstrate the integration of energy converting biological proteins with an external device, and point the way toward a manufacturing pathway capable of large-scale production of biosolar cells capable of powering a wide variety of devices.

Figure 12:
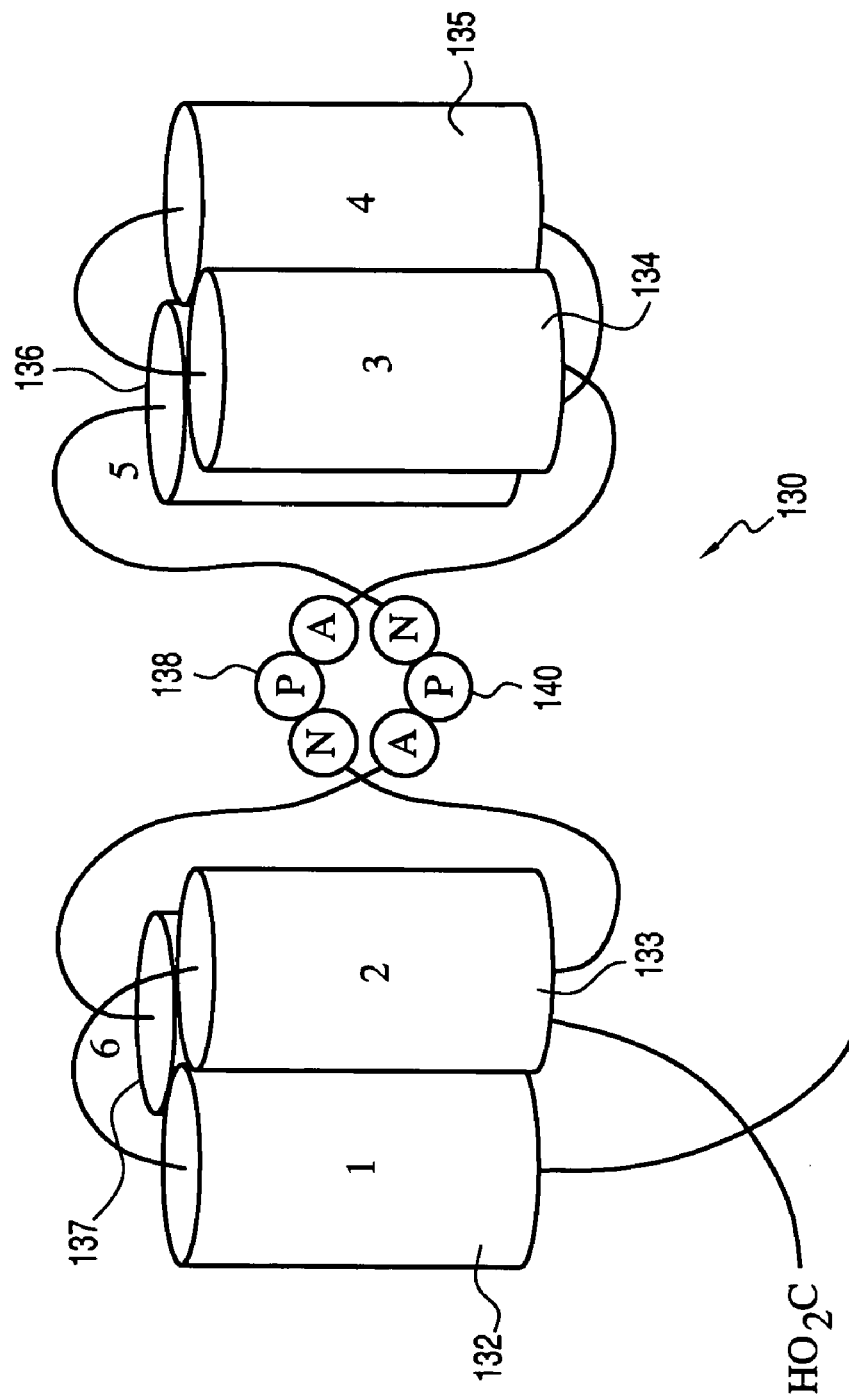
FIG. 12 is a diagrammatic illustration of an aquaporin protein.
Figure 13:
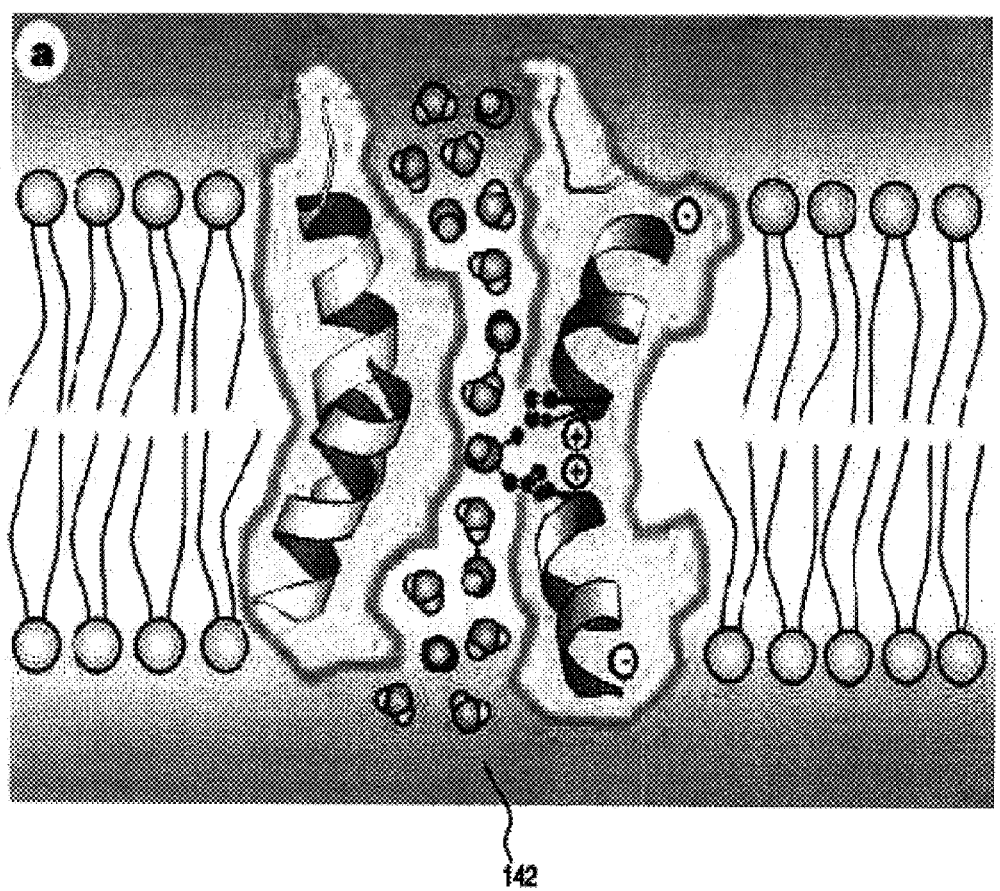
FIG. 13 is an enlarged view of a portion of the protein of FIG. 12.
Figure 14:
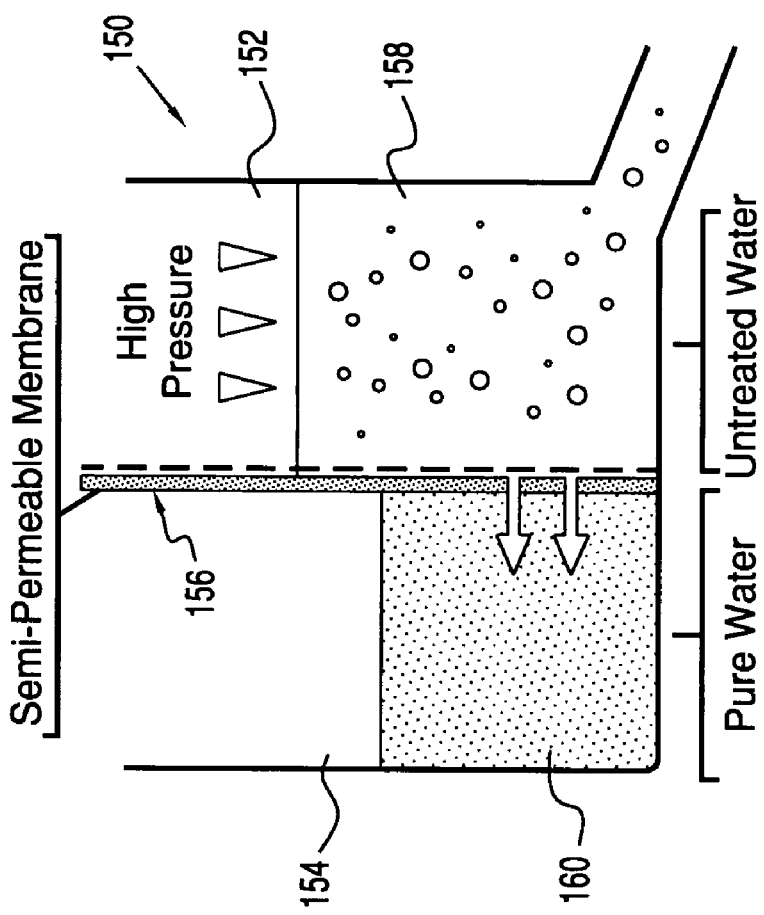
FIG. 14 illustrates a water purification cell using a membrane incorporating aquaporins.

In another aspect of the invention, through the use of the Aquaporin family of proteins incorporated into tri-block co-polymer membranes, stable films are produced which will only pass water, thus facilitating water purification, desalinization, and molecular concentration through dialysis. The aquaporins exclude the passage of all contaminants, including bacteria, viruses, minerals, proteins, DNA, salts, detergents, dissolved gases, and even protons from an aqueous solution, but aquaporin molecules are able to transport water because of their structure. Every aquaporin 130, as diagrammatically illustrated in FIG. 12, is comprised of six transmembrane alpha-helical domains 132–137 that anchor the protein in a membrane and two highly conserved NPA loops 138 and 140 that come together apex to apex in the center of the protein to form a kind of hourglass shape. The narrowing in this hourglass is where water molecules actually pass through the membrane in single file, as illustrated at 142 in FIG. 13. It has been shown that water movement is symmetrical and can proceed in either direction; this fact is important because this process does not consume energy. Water moves through the membrane in a particular direction because of hydraulic or osmotic pressure. As illustrated in FIG. 14, water purification/desalinization can be achieved with a two-chambered device 150 having chambers 152 and 154 separated by a rigid membrane 156 at its center that is filled with aquaporins. This membrane itself impermeable to water and separates contaminated water 158 in chamber 152 from purified water 160 in chamber 154. Only pure water is able to flow between the two chambers. Thus, when sea water or other contaminated water 158 on one side of the membrane is placed under an appropriate pressure, pure water naturally flows into the other chamber 154. Accordingly, purified water can be obtained from undrinkable sources or, if the source water contained chemicals of interest, the water can be selectively removed, leaving a high concentration of the wanted chemicals in the input chamber. Importantly, however, the aquaporins are also suited to this invention for reasons other than their exclusive selectivity for water. Many members of this protein family (such as AquaporinZ (AqpZ) are extremely rugged and can withstand the harsh conditions of contaminated source water without losing function. AqpZ resists denaturing or unraveling from exposure to acids, voltages, detergents, and heat. Therefore, the device can be used to purify source water contaminated with materials that might foul or destroy another membrane, and it can be used in areas that experience consistently high temperatures.

AqpZ is also mutable. Since this protein is specifically expressed in host bacteria according to a genetic sequence that influences its final shape and function, a technician can easily change its genetic code in order to change the protein's characteristics. Therefore the protein can be engineered to fulfill a desired application that may be different from the protein's original function. For example, by simply changing a particular amino acid residue near the center of the water channel 142 illustrated in FIG. 13 to cysteine, the Aquaporins produced would bind any free Mercury in the solution and cease transporting water due to the blockage. Thus, these mutant proteins used in a membrane device could detect Mercury contamination in a water sample by simply ceasing flow when the concentration of the toxic substance rises too high.

The preferred form of the invention has the form of a conventional filter disk because it is most easily assayed for functionality that way. To fabricate such a disk, a 5 nm thick monolayer of synthetic triblock copolymer and protein is deposited on the surface of a 25 mm commercial ultrafiltration disk using a Langmuir-Blodgett trough. The monolayer on the disk is then exposed to 254 nm UV light to cross-link the polymer and increase its durability. Lastly, a 220 nm pore size PVDF membrane is epoxy glued to the disk surface to ensure safe handling and prevent leakage at the edges.

The device is assayed by fitting it in a chamber, such as that illustrated in FIG. 14, that forces pressurized source water across the membrane. The device is considered functional when only pure water comes through the other side of the membrane and contaminating solutes remain concentrated in the originating chamber. The contaminated solution must be pressurized in order to overcome the natural tendency of pure water to flow into the chamber which has the higher number of dissolved particles. It is the purpose of the Aquaporin Z membrane to reverse osmosis and separate the pure water from contaminating solutes. This tendency, or osmotic pressure, of the system can be expressed in pounds per square inch (psi). For example, the osmotic pressure of seawater is roughly 360 psi.

There are several methods that can be used to allow the device to tolerate these types of pressures. Some varieties of polymer are naturally more durable than others, and can be cross-linked with UV light to provide extra rigidity. Another method is to add a high concentration of a non-toxic and easily removable solute to the freshwater chamber to encourage regular osmosis across the membrane while reverse osmosis is also occurring due to chamber pressurization. Lastly, the pressure required for reverse osmosis can be reduced by using multiple AqpZ devices in a cascade of sealed, connected chambers containing successively smaller concentrations of contaminants. The resulting pressure required to purify water in each pair of chambers is a fraction of the total pressure necessary for reverse osmosis. Therefore, each membrane only has to withstand a small pressure and has a greater chance of remaining intact. So, if the difference in concentration between each pair of chambers was only 10% instead of 100%, just 10% of the high pressure mentioned above would be needed to purify the source water at each junction. Pure water would be continuously produced in the final chamber with constant pressure and flow.

Figure 15:
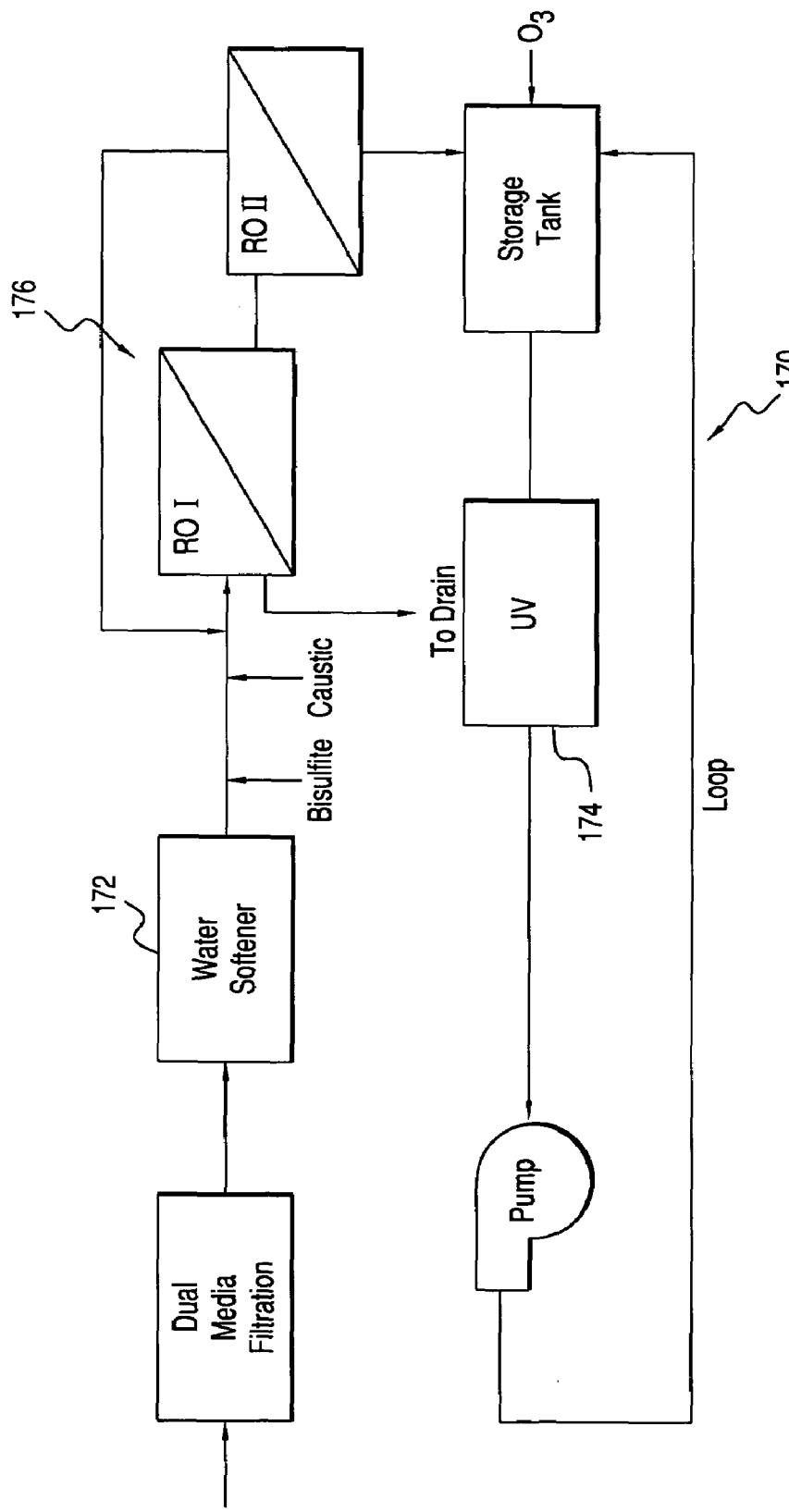
FIG. 15 is a diagrammatic illustration of a traditional water purification system.

The aquaporin reverse osmosis membrane can purify water possessing several different types of contamination in only a single step. Traditional high purity systems such as that illustrated at 170 in FIG. 15, require several components that can include a water softener 172, carbon filters, ion exchangers, UV or chemical sterilization 174, and a two pass reverse osmosis filter set 176 to be used in conjunction before water (that is not as clean as aquaporin-purified water) can be produced. This elaborate set up cannot remove dissolved gases or substances smaller than 150 Daltons from the source water like the aquaporin membrane can. Furthermore, all these components require maintenance. UV bulbs require replacement and energy. Ion exchangers need to be chemically regenerated when they are full. Softeners require salt. Carbon and reverse osmosis cartridges must be replaced when they become fouled. Finally, a single step device would require much less space and weigh far less than a typical purification system, and this advantage enables the Aquaporin water purification devices of the present invention to be portable.

Aquaporin membranes are also faster than conventional systems. A conventional high speed R.O. unit can make about 28.4 liters (7.5 gallons) of clean water every minute. Current research shows the movement of water molecules across an AqpZ saturated lipid membrane (0.0177 mm$^2$) at the rate of 54 μmoles/sec. (Pohl, P., Saparov, S. M., Borgnia, M. J., and Agre, P., (2001), Proceedings of the National Academy of Sciences 98, p. 9624–9629) Thus, a theoretical Aquaporin Z Reverse Osmosis Membrane with a surface area of 1.0 square meter could filter up to 3295 liters of pure water every minute. That rate is over 116 times faster than a normal purifier.

Lastly, new protein-based membranes are also very inexpensive to produce. The heart of the process, AqpZ, is easily harvested in milligram quantities from an engineered *E. coli* bacterial strain. On average, 2.5 mg of pure protein can be obtained from each liter of culture that is producing it. 10 mg of protein can be produced from about 5 dollars of growth media. That is enough protein for several full size devices. Also, the polymer in which the AqpZ is imbedded can be produced in the same laboratory for just pennies worth of chemicals for each device. The Aquaporin Z Reverse Osmosis Membrane is a novel, efficient, and inexpensive means of water purification.

Thus, there has been disclosed methods and apparatus utilizing biological components to achieve the highly efficient production of completely pure water from fouled, salty, or otherwise contaminated water. The invention demonstrates the integration of water transporting biological proteins with an external device, and points the way toward a manufacturing pathway capable of large-scale production of water purification devices.

Although the present invention has been described in terms of preferred embodiments, it will be understood that numerous variations and modifications of the methods and devices disclosed herein may be made without departing from the true spirit and scope of the invention, as set out in the following claims.

What is claimed is:

1. A biomimetic membrane, comprising:
a tri-block copolymer matrix simulating a natural biological membrane and natural protein environment; and
membrane proteins incorporated into said matrix to form a membrane/protein composite.

2. The membrane of claim 1, wherein the membrane/protein composite composes a device which has the function of the incorporated membrane proteins.

3. The membrane of claim 2, wherein the protein functions include valves, channels, sensors, detectors, pumps, and energy transducers.

4. The membrane of claim 1, wherein said membrane proteins are selected to transport only water molecules, whereby said biomimetic membrane is a water filter.

5. The membrane of claim 4, wherein said membrane proteins are selected from the aquaporin family of proteins.

6. The membrane of claim 5, wherein said matrix is impermeable to water, and wherein said membrane proteins are selected to permit passage of water molecules under pressure.

7. The membrane of claim 6, wherein said matrix is supported in a water purification device to separate said device into first and second chambers, said membrane proteins permitting only water to flow between said chambers.

8. The membrane of claim 1, wherein said membrane proteins are genetically engineered proteins.

9. The membrane of claim 8, wherein two different membrane proteins are incorporated into said matrix.

10. The membrane of claim 9, wherein said membrane proteins are energy converting proteins.

11. The membrane of claim 1, wherein said matrix is incorporated in a thin fabric.

12. The membrane of claim 11, wherein said membrane proteins include bacteriorodopsin and cytochrome oxydase embedded in said matrix for converting optical energy to electrical energy.

13. The membrane of claim 12, further including first and second electrodes on opposite surfaces of said fabric for receiving said electrical energy.

14. The membrane of claim 1, wherein said matrix receives oriented bacteriorodopsin and cytochrome oxidase to produce a biosolar cell.

15. The membrane of claim 14, further including electrodes on opposite sides of said matrix.

16. The membrane of claim 14, wherein said matrix is a biocompatible polymer impermeable to protons.

17. A hybrid organic/inorganic power source, comprising:
a tri-block copolymer matrix; and
first and second different membrane proteins embedded in said matrix.

18. The power source of claim 17, further including a thin fabric material, said matrix being embedded in said fabric.

19. The power source of claim 18, wherein said membrane proteins are natural biological proteins.

20. The power source of claim 19, wherein said proteins comprise bacteriorodopsin and cytochrome oxidase for converting light energy into electrical energy.

21. The power source of claim 20, further including electrodes on opposed surfaces of said fabric for receiving said electrical energy.

22. A method of fabricating a biological membrane, comprising:

fabricating a tri-block copolymer matrix; and
inserting in said matrix natural or genetically engineered membrane proteins.

23. The method of claim 22, further including orienting said membrane proteins in said matrix.

24. The method of claim 22, further including selecting said proteins to produce a corresponding membrane functionality.

25. The method of claim 22, further including inserting in said matrix two different membrane proteins.

26. The method of claim 25, further including exposing said matrix to light to produce electrical energy across said matrix.

* * * * *